US010170278B2

(12) United States Patent
Nguyen et al.

(10) Patent No.: US 10,170,278 B2
(45) Date of Patent: Jan. 1, 2019

(54) INDUCTIVELY COUPLED PLASMA SOURCE

(71) Applicant: APPLIED MATERIALS, INC., Santa Clara, CA (US)

(72) Inventors: Andrew Nguyen, San Jose, CA (US); Kartik Ramaswamy, San Jose, CA (US); Yang Yang, Sunnyvale, CA (US); Steven Lane, Porterville, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 534 days.

(21) Appl. No.: 13/833,220

(22) Filed: Mar. 15, 2013

(65) Prior Publication Data
US 2014/0196849 A1 Jul. 17, 2014

Related U.S. Application Data

(60) Provisional application No. 61/751,502, filed on Jan. 11, 2013.

(51) Int. Cl.
H01J 37/32 (2006.01)

(52) U.S. Cl.
CPC ......... *H01J 37/321* (2013.01); *H01J 37/3211* (2013.01)

(58) Field of Classification Search
CPC .................. H01J 37/321; H01J 37/3211
See application file for complete search history.

(56) References Cited

U.S. PATENT DOCUMENTS 5,565,738 A * 10/1996 Samukawa et al. ..... 315/111.51
5,865,896 A *  2/1999 Nowak et al. ............. 118/723 I
5,900,699 A *  5/1999 Samukawa et al. ..... 315/111.51
(Continued)

FOREIGN PATENT DOCUMENTS

JP        10050666 A  *  2/1998
JP      2002151481 A  *  5/2002
JP      2004055895 A  *  2/2004

OTHER PUBLICATIONS

White, Curtis. "Ferrite Cores the Rest of the Story." Oct. 29, 2009.*
(Continued)

*Primary Examiner* — Yuechuan Yu
(74) *Attorney, Agent, or Firm* — Moser Taboada; Alan Taboada

(57) ABSTRACT

Embodiments of methods and apparatus for plasma processing are provided herein. In some embodiments, an inductively coupled plasma apparatus may include a bottom wall comprising a hub and a ring coupled to the hub by a capacitor, wherein the hub and the ring are each electrically conductive, and where the hub has a central opening aligned with a central axis of the inductively coupled plasma apparatus; a top wall spaced apart from and above the bottom wall, wherein the top wall has a central opening aligned with the central axis, and wherein the tope wall is electrically conductive; a sidewall electrically connecting the ring to the top wall; and a tube electrically connecting the hub to the top wall, the tube having a central opening aligned with the central axis.

14 Claims, 3 Drawing Sheets

(56) References Cited

U.S. PATENT DOCUMENTS

| | | | |
|---|---|---|---|
| 6,155,199 A * | 12/2000 | Chen | H01J 37/32082 118/723 I |
| 6,418,874 B1 * | 7/2002 | Cox et al. | 118/723 I |
| 2002/0023899 A1 | 2/2002 | Khater et al. | |
| 2002/0033233 A1 | 3/2002 | Savas | |
| 2002/0157608 A1 * | 10/2002 | Nakano et al. | 118/723 MW |
| 2003/0111962 A1 * | 6/2003 | Shannon et al. | 315/111.41 |
| 2005/0039681 A1 * | 2/2005 | Fukiage | 118/723 E |
| 2008/0122367 A1 | 5/2008 | Vinogradov et al. | |
| 2009/0042321 A1 | 2/2009 | Sasaki et al. | |
| 2011/0094994 A1 | 4/2011 | Todorow et al. | |
| 2011/0097901 A1 | 4/2011 | Banna et al. | |
| 2011/0104902 A1 | 5/2011 | Yamazawa et al. | |
| 2012/0034136 A1 * | 2/2012 | Collins et al. | 422/186.29 |

OTHER PUBLICATIONS

International Search Report and Written Opinion dated Apr. 28, 2014 for PCT Application No. PCT/US2014/010843.

* cited by examiner

INDUCTIVELY COUPLED PLASMA SOURCE

CROSS-REFERENCE TO RELATED APPLICATIONS

This application claims benefit of U.S. provisional patent application Ser. No. 61/751,502, filed Jan. 11, 2013, which is herein incorporated by reference.

FIELD

Embodiments of the present invention generally relate to plasma processing equipment.

BACKGROUND

Inductively coupled plasma (ICP) reactors generally form plasmas by inducing current in a process gas disposed within a process chamber via one or more inductive coils disposed outside of the process chamber. The inductive coils are typically disposed above the chamber and connected to a radio frequency (RF) power source.

Due to the configuration of the one or more inductive coils above the process chamber, process gases are typically introduced into the chamber from entry ports in sidewalls of the chamber. When RF current is fed to the inductive coils via a feed structure from an RF power source, an electric field generated by the inductive coils can form an inductively coupled plasma from the process gases.

However, the inventors have observed that process gases introduced from the side of the chamber can cause non-uniformities in the plasma formation within the chamber.

Accordingly, the inventors have devised an improved inductively coupled plasma process apparatus as described herein.

SUMMARY

Embodiments of methods and apparatus for plasma processing are provided herein. In some embodiments, an inductively coupled plasma apparatus may include a bottom wall comprising a hub and a ring coupled to the hub by a capacitor, wherein the hub and the ring are each electrically conductive, and where the hub has a central opening aligned with a central axis of the inductively coupled plasma apparatus; a top wall spaced apart from and above the bottom wall, wherein the top wall has a central opening aligned with the central axis, and wherein the tope wall is electrically conductive; a sidewall electrically connecting the ring to the top wall; and a tube electrically connecting the hub to the top wall, the tube having a central opening aligned with the central axis.

In some embodiments, an inductively coupled plasma reactor may include a chamber body having a processing volume; and an inductively coupled plasma apparatus according to any of the embodiments described herein to couple RF energy into the processing volume.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 1A depicts a detail of a portion of the inductively coupled plasma reactor of FIG. 1.

Figure 1:
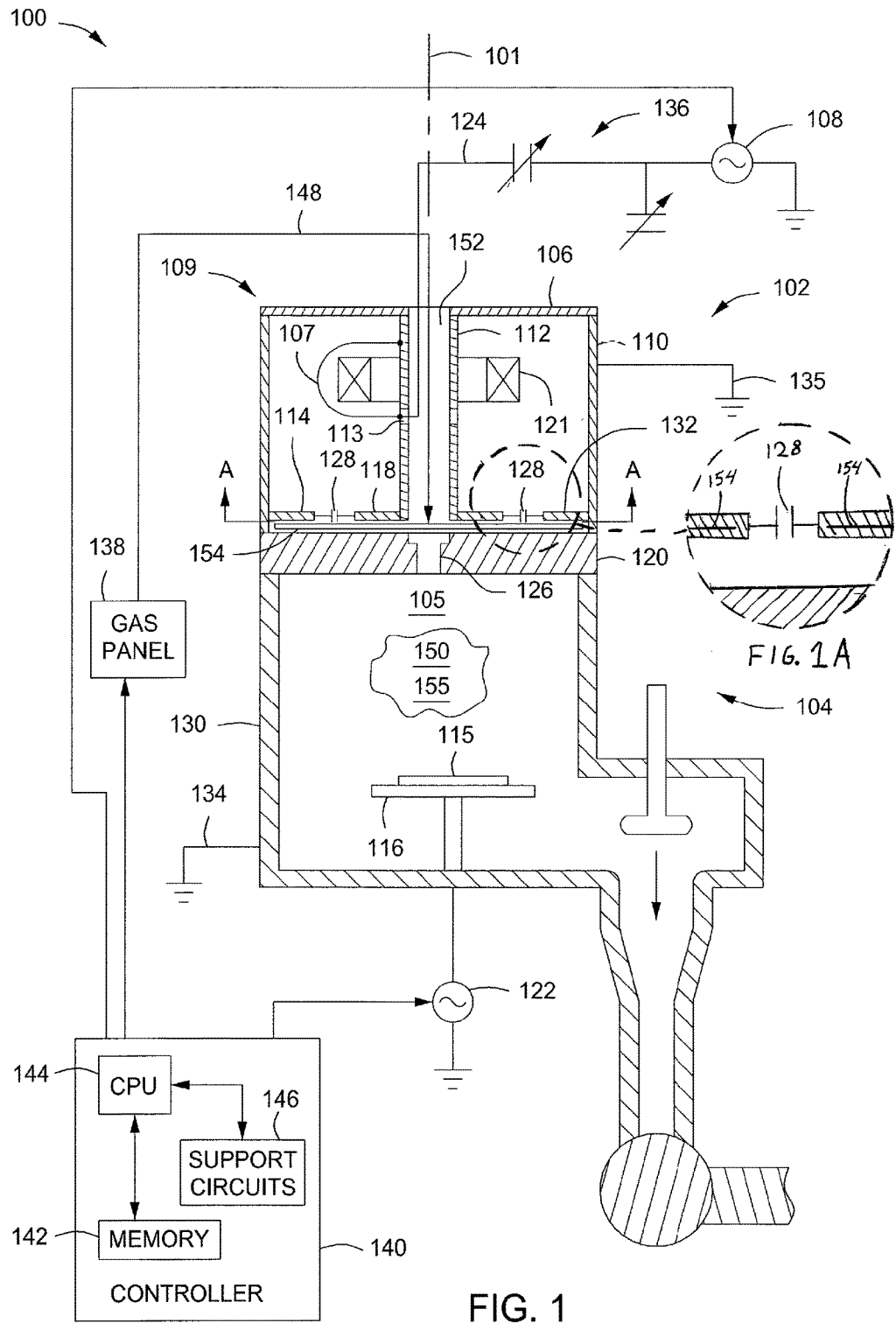
FIG. 1 depicts a schematic side sectional view of an inductively coupled plasma reactor in accordance with embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for plasma processing are provided herein. The inventive methods and plasma processing apparatus may advantageously provide a more uniform plasma to a process chamber as compared to conventional apparatus. In addition, the inventive methods and plasma processing apparatus may advantageously provide a more uniform plasma as compared to conventional apparatus when sized to accommodate a range of diameter substrates, e.g., from 200 mm to 450 mm, thus providing a more uniform processing result on a substrate being processed with the plasma.

FIG. 1 depicts a schematic side view of an inductively coupled plasma (ICP) reactor (reactor 100) including an ICP apparatus 102 in accordance with embodiments of the present invention. The reactor 100 generally includes a process chamber 104, having a conductive body (wall) 130 and a dielectric lid 120 that together define an inner volume 105, the ICP apparatus 102 disposed above the dielectric lid 120 (sometimes referred to as a dielectric window), and a controller 140. A substrate support 116, illustratively shown with a substrate 115 disposed thereon, is disposed within the inner volume 105. The wall 130 is typically coupled to an electrical ground 134. In some embodiments, the substrate support 116 may be configured as a cathode coupled to a biasing power source 122. The biasing source 122 may illustratively be a source of up to about 1000 W (but not limited to about 1000 W) at a frequency of approximately 13.56 MHz that is capable of producing either continuous or pulsed power, although other frequencies and powers may be provided as desired for particular applications. In other embodiments, the source 122 may be a DC or pulsed DC source. In some embodiments, the source 122 may be capable of providing multiple frequencies or one or more second sources (not shown) may be coupled to the substrate support 116 to provide multiple frequencies.

As illustrated in FIG. 1, the dielectric lid 120 is substantially flat. The ICP apparatus 102 is typically disposed above the lid 120 of the process chamber 104 and is configured to inductively couple radio frequency (RF) energy into the process chamber 104.

The ICP apparatus 102 generally includes a top wall 106 and a bottom wall 132 coupled together at a radially outer portion by a sidewall 110 and at a radially inner portion by a tube 112. The bottom wall 132 includes a ring 114 and a hub 118 electrically coupled together by a plurality of capacitors 128. The top wall, ring 114, hub 118, sidewall 110, and tube 112 are each electrically conductive. For example, the hub 118, ring 114, sidewall 110, top wall 106, and tube 112 may be formed from any process compatible metallic material, for example aluminum.

The top wall 106 is electrically coupled at an outer portion to a first end of the sidewall 110 and electrically coupled at an inner portion to a first end of the tube 112. The top wall 106 may include a central opening that is aligned with a central opening 152 of the tube 112. The second end of the sidewall 110 is electrically coupled to a first edge portion of the ring 114 and the second end of the tube 112 is electrically coupled to an edge portion of the hub 118. The hub 118 may include a central opening that is aligned with a central opening of the tube 112. The tube 112, the top wall 106, the sidewall 110, and the bottom wall 132 effectively form a toroidal coil, coil 109, about axial centerline 101.

Figure 2:
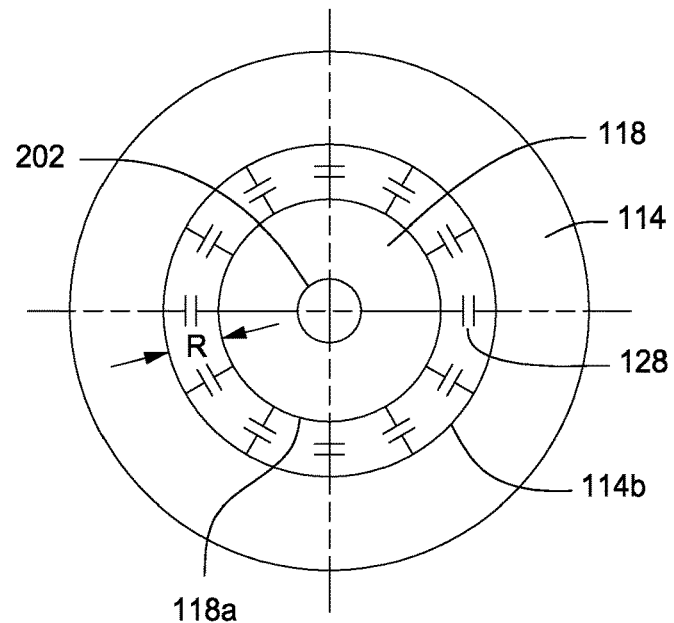
FIG. 2 depicts a sectional view of an embodiment of the inductively coupled plasma apparatus of FIG. 1 taken along line A-A of FIG. 1.

In the non-limiting embodiment illustrated in FIG. 2, the hub 118 and the ring 114 are concentric annular rings with the hub 118 inside the ring 114. The hub 118 has a central opening 202. The outer radius 118a of the hub 118 is less than the inner radius 114b of the ring 114 such that the hub 118 and ring 114 are spaced apart by a gap R. Bridging the gap R is a plurality of capacitors 128 such that the hub 118 and ring 114 are electrically coupled. Twelve capacitors 128 are shown for illustrative purposes only. A greater number or lesser number of capacitors 128 may be used.

Figure 3:
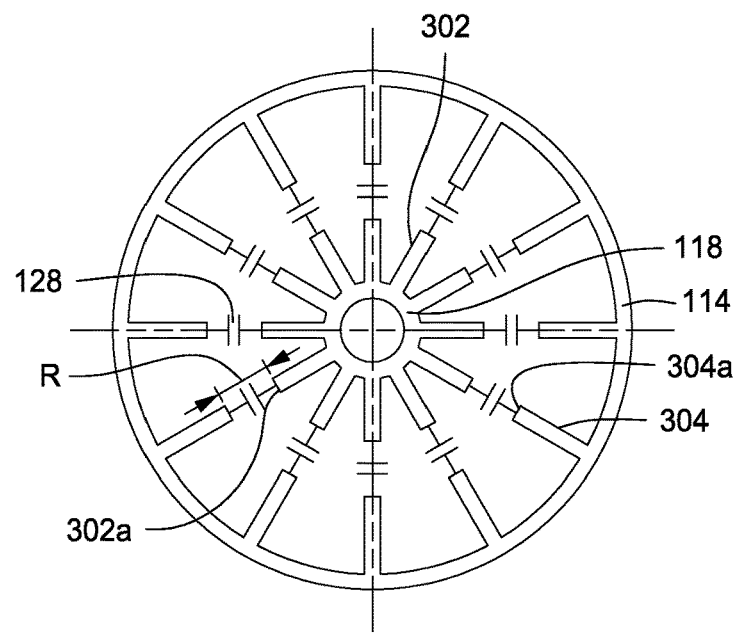
FIG. 3 depicts a sectional view of an embodiment of the inductively coupled plasma apparatus of FIG. 1 taken along line A-A of FIG. 1.

In an alternate non-limiting embodiment illustrated in FIG. 3, the hub 118 comprises a plurality of radially outwardly directed spokes 302 and the ring 114 comprises a plurality of radially inwardly directed spokes 304. The radially outwardly directed ends 302a of the spokes 302 are spaced apart from the radially inwardly directed ends 304a of the spokes 304 by a gap R. Bridging each gap R is a capacitor 128 such that the hub 118 and the ring 114 are electrically coupled.

Returning to FIG. 1, an optional ferrite core 121 may encircle a portion of the tube 112. In some embodiments, the ferrite core 121 may be formed from materials having a high magnetic permeability such as, but not limited to, Ni—Zn, for example. The relative magnetic permeability ($\mu/\mu_0$) of the ferrite core 121 may be between about 10 $\mu/\mu_0$ and 10,000 $\mu/\mu_0$, although other materials having different relative magnetic permeability may also be used depending on the operating frequency of the RF current flows used. In some embodiments, the type of ferrite material used is selected based on the temperature dependency of resistivity and permeability of the ferrite.

Primary energy input 107 may make one or more turns within the coil 109 to form a coil 103 (FIG. 5) before terminating at an electrically conductive portion of the coil 109, for example top wall 106. In some embodiments, the coil 103 may be formed by one or more turns about the optionally provided ferrite core 121 before terminating at an electrically conductive portion of the coil 109, for example at tube 112. The ferrite core 121 may beneficially increase the inductance of the coil 103 and may beneficially influence the induced current in the coil 109. The ferrite core 121 may also increase the inductance in the coil 109 formed by the tube 112, the top wall 106, the sidewall 110, and the bottom wall 132. If included, the ferrite core 121 may advantageously influence the formation of the field generated by the ICP apparatus 102.

Figure 4:
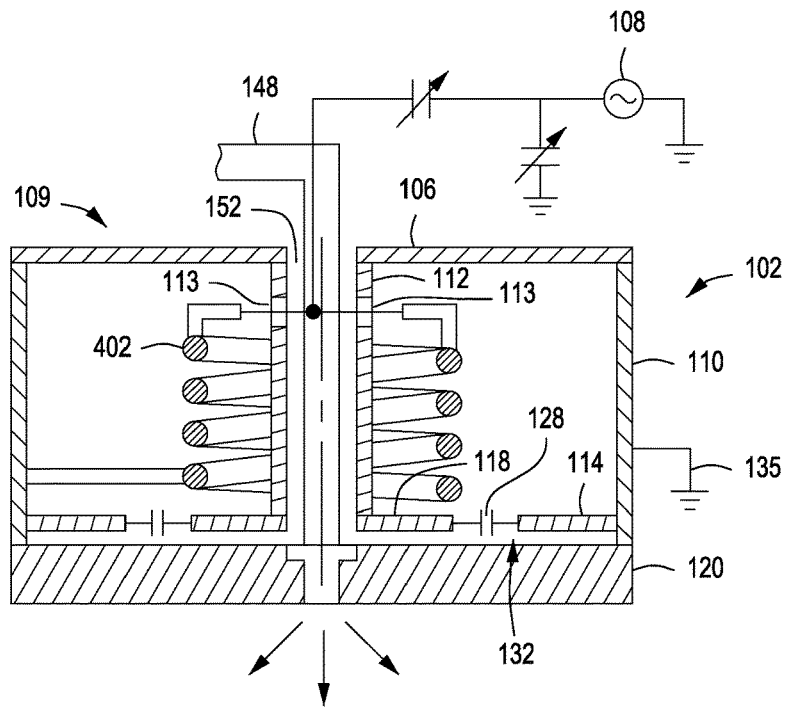
FIG. 4 depicts a schematic side sectional view of an inductively coupled plasma apparatus in accordance with embodiments of the present invention.

In some embodiments, and as depicted in FIG. 4, a primary inductor coil 402 is wound about the tube 112 in place of the optional ferrite core 121. In some embodiments, a primary inductor coil 402 may be provided in combination with a ferrite core (not shown). The ferrite core may increase the inductance of the coil, advantageously influencing the inductive plasma formation. A first end of the coil 402 is electrically coupled to the RF power source 108 and a second end is coupled to the sidewall 110 (as shown) or to the ring 114, and ultimately, to ground connection 135. When energized, the coil 402 induces a current in the tube 112, top wall 106, sidewall 110 and bottom wall 132 (i.e., coil 109). As discussed below, the central opening 152 of the tube 112 has a zero, or near zero, electric field when RF power is provided to the apparatus, thereby advantageously allowing apparatus elements, for example gas distribution conduit 148, to be placed inside the tube 112 without adversely effecting or being affected by the electromagnetic field generated by the ICP apparatus 102.

In the non-limiting embodiment of FIG. 4, the coil 402 is illustrated as a cylindrical coil for ease of illustration only. Differently shaped coils, for example conical shaped coils, may be used as well. The coil 402 may also be wound from a plurality of conductive elements, each individually coupled to the power source 108 and each individually coupled to a ground connection 135. The relative position along the tube 112, the number of turns, and the profile of the coil 402 can each adjusted as desired to control, for example, the profile or density of the plasma being formed via controlling the inductance in the coil 109. The diameter of the coil 402 may affect the characteristics of the plasma formed, thereby affecting the process result on a substrate being processed with the plasma. The inventors have observed that a coil 402 diameter close to the diameter of the tube 112 has a more direct affect on the processing of the center of the substrate. Similarly, a coil 402 having a larger diameter, that is a diameter close to that of the substrate, has been observed to affect the processing of the perimeter regions of the substrate.

Figure 5:
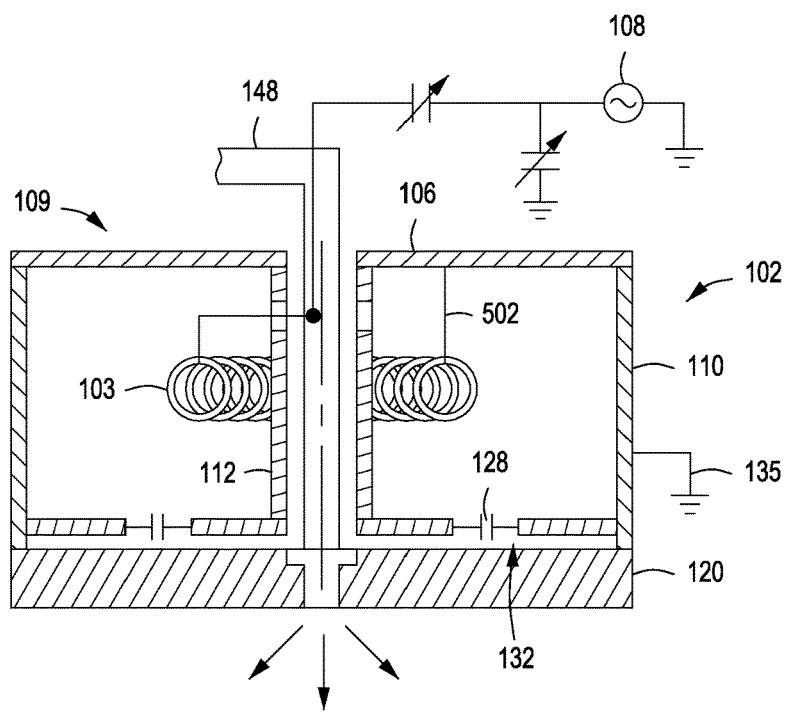
FIG. 5 depicts a schematic side sectional view of an inductively coupled plasma reactor including an inductively coupled plasma apparatus in accordance with embodiments of the present invention.

FIG. 5 is illustrative of an inductively coupled plasma apparatus in which the coil 103 does not include a ferrite core. This is sometimes referred to as an air core coil. Primary energy input 107 is coupled to one or more (one shown) helically coiled structures wound about a path encircling the tube 112, forming a toroid (e.g., a toroidal path). In some embodiments the toroidal path is substantially planar. In some embodiments, the toroidal path is substantially perpendicular to the central axis of the tube 112. The center of the toroid is aligned with a path around the tube 112 forming a toroidal coil, i.e., coil 103. The coil is coupled to ground, for example through a ground connection 502 to an electrically conductive portion of the ICP apparatus 102, for example the coil 109 as shown, or directly to ground.

Returning to FIG. 1, in some embodiments, a heater may be provided proximate the dielectric lid 120. For example, a heater 154 may be disposed between the dielectric lid 120 and the bottom wall 132. Alternatively or in combination, the heater 154 may be embedded in or disposed on either the hub 118 or the ring 114 or in both the hub 118 and the ring 114 (as shown in FIG. 1A). For example, in some embodiments, the hub 118 and/or the ring 114 may be formed from a top piece and a separate mating bottom piece, with the top and bottom pieces configured to contain one or more heater elements between the mating surfaces. The top and bottom pieces may be joined together by appropriate joining techniques, such as welding or with the use of mechanical fasteners. Desirable components, for example heaters 154, may be embedded or otherwise incorporated with the hub 118 or the ring 114 and provided with a separate power source. Other desirable components for example a Faraday shield may additionally, or alternately, be embedded in the hub 118 or the ring 114.

An RF power source 108 is coupled to the ICP apparatus 102. The RF power source 108 can provide RF power at a frequency and power as appropriate for a particular application and/or chamber configuration. For example, the RF power source 108 may illustratively be capable of producing up to about 5000 W (but not limited to about 5000 W) at a fixed or tunable frequency in a range from about 50 kHz to about 62 MHz, although other frequencies and powers may be provided as desired for particular applications.

The RF power source 108 is coupled to the ICP apparatus 102 via a power lead 124 coupled to a primary energy input 107. Matching circuitry 136 may be provided to match the impedance of the plasma in the process chamber to minimize RF power reflected back to the RF power source 108. As depicted in FIG. 1, in some embodiments the power lead 124 extends through a portion of the central opening 152 of tube 112 and passes through an aperture 113 in the tube 112 into the hollow center of the coil 109. The power lead 124 terminates at a conductive component of the ICP apparatus 102, for example at a radially outer surface of the tube 112 or an inner surface of the top wall 106. The ICP apparatus 102 further includes a ground connection 135 to provide an RF path to ground. In some embodiments, the ground connection 135 is disposed on the sidewall 110. This is sometimes referred to as a tuned transformer coupled system.

When receiving power from the RF power source 108, the ICP apparatus 102 forms an electric field that advantageously energizes process gases provided to the inner volume of the process chamber to form a plasma. The tube 112, the top wall 106, the side wall 110, the ring 114, the hub 118 and the capacitors 128 form a coil 109 configured as a one turn air core toroidal coil. In embodiments including a ferrite core positioned about the tube 112, the coil 109 is configured as a ferrite based toroidal coil. The coil 109 may form a primary winding of a transformer. This primary winding may be driven by another matching network (not shown) consisting of a series and shunt capacitor When energized, for example when provided with power from the RF power source 108, coil 109 facilitates the formation of a plasma in the process chamber 104.

The inventors have noted that an ICP apparatus constructed as described above produces a zero, or near zero, magnetic field in the central opening 152 (FIG. 1) of the tube 112. A zero, or near zero, magnetic field at the open center of the tube 152 allows placement of apparatus elements, for example gas distribution conduit 148, inside the tube 112 without adversely effecting the function of the ICP apparatus 102. Other elements may be placed in the central opening 152 as well.

The controller 140 comprises a central processing unit (CPU) 144, a memory 142, and support circuits 146 for the CPU 144 and facilitates control of the components of the reactor 100, such as the gas panel 138, the power source 108, and the biasing power source 122, and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The memory 142 stores software (source or object code) that may be executed or invoked to control the operation of the reactor 100 in the manner described herein. The software routine may also be stored and/or executed by a second CPU (not shown) that is remotely located from the hardware being controlled by the CPU 144.

During operation, the substrate 115 (such as a semiconductor wafer or other substrate suitable for plasma processing) may be placed on the substrate support 116 and process gases may be supplied from a gas panel 138 through a gas distribution conduit 148 and a gas distribution device, for example nozzle 126, to form a gaseous mixture 150 within the process chamber 104. Other gas distribution devices, such as a showerhead, may be used. The gaseous mixture 150 may be ignited into a plasma 155 in the process chamber 104 by applying power from the power source 108 to the ICP apparatus 102. In some embodiments, power from the bias source 122 may be provided to the substrate support 116.

Thus, an apparatus for plasma processing are provided herein. The inventive ICP apparatus advantageously facilitates the formation of a uniform plasma above a substrate within a process chamber. A plasma formed utilizing the inventive ICP apparatus is more uniformly formed and distributed, providing a more uniform processing result on a substrate being processed with the plasma.

While the foregoing is directed to embodiments of the present invention, other and further embodiments of the invention may be devised without departing from the basic scope thereof.

The invention claimed is:

1. An inductively coupled plasma apparatus, comprising:
   a bottom wall comprising a hub having a plurality of radially outwardly directed spokes and a ring having a corresponding plurality of radially inwardly directed spokes, wherein each radially inwardly directed spoke lies along a common radius as a corresponding one of the plurality of radially outwardly directed spokes, wherein the hub and the ring are each electrically conductive, and wherein the hub has a central opening aligned with a central axis of the inductively coupled plasma apparatus;
   a plurality of capacitors, one each disposed between and coupling respective ends of each radially outwardly directed spoke and corresponding radially inwardly directed spoke;
   a top wall spaced apart from and above the bottom wall, wherein the top wall has a central opening aligned with the central axis, and wherein the top wall is electrically conductive;
   a sidewall electrically connecting the ring to the top wall; and
   a tube electrically connecting the hub to the top wall, the tube having a central opening aligned with the central axis.

2. The apparatus of claim 1, further comprising:
a dielectric plate disposed below the bottom wall and comprising a gas distribution device axially aligned with the tube.

3. The apparatus of claim 2, further comprising:
a gas conduit fluidly coupled to the gas distribution device and extending through the central openings of the tube and the top wall.

4. The apparatus of claim 1, wherein at least one of the hub or the ring comprises a heater.

5. The apparatus of claim 1, further comprising a ferrite core encircling a portion of the tube.

6. The apparatus of claim 1, further comprising a conductive coil wound about a portion of the tube and coupled to a ground through an electrically conductive portion of the apparatus.

7. The apparatus of claim 6, wherein the conductive coil is helically wound about a toroidal path encircling the tube.

8. The apparatus of claim 7, wherein the conductive coil is electrically coupled to ground.

9. The apparatus of claim 7, wherein the conductive coil is wound about a ferrite core.

10. The apparatus of claim 1, further comprising:
a primary energy input, a first end of which is electrically bonded to an electrically conductive portion of the apparatus.

11. The apparatus of claim 10, wherein the primary energy input is electrically bonded to at least one of the tube or the top wall.

12. The apparatus of claim 10, further comprising:
a conductive coil wound about a portion of the tube and having a first end coupled to the ring or the sidewall, wherein the primary energy input is electrically bonded to a second end of the conductive coil opposite the first end.

13. The apparatus of claim 10, wherein a second end of the primary energy input is coupled to a power source.

14. An inductively coupled plasma reactor, comprising:
a chamber body having a processing volume; and
an inductively coupled plasma apparatus supported by the chamber body to couple RF energy into the processing volume, comprising:
a bottom wall comprising a hub having a plurality of radially outwardly directed spokes and a ring having a corresponding plurality of radially inwardly directed spokes, wherein each radially inwardly directed spoke lies along a common radius as a corresponding one of the plurality of radially outwardly directed spokes, wherein the hub and the ring are each electrically conductive, and wherein the hub has a central opening aligned with a central axis of the inductively coupled plasma apparatus;
a plurality of capacitors, one each disposed between and coupling respective ends of each radially outwardly directed spoke and corresponding radially inwardly directed spoke;
a top wall spaced apart from and above the bottom wall, wherein the top wall has a central opening aligned with the central axis, and wherein the top wall is electrically conductive;
a sidewall electrically connecting the ring to the top wall;
a tube electrically connecting the hub to the top wall, the tube having a central opening aligned with the central axis;
a dielectric plate disposed below the bottom wall and comprising a gas distribution device axially aligned with the tube;
a gas conduit fluidly coupled to the gas distribution device and extending through the central openings of the tube and the top wall; and
a conductive coil wound about a portion of the tube and coupled to an electrically conductive portion of the apparatus.

* * * * *